United States Patent [19]

Comey

[11] Patent Number: 4,812,653

[45] Date of Patent: Mar. 14, 1989

[54] SHARP EDGE FOR THICK COATINGS

[75] Inventor: David M. Comey, Concord, Mass.

[73] Assignee: Honeywell Inc., Minneapolis, Minn.

[21] Appl. No.: 127,078

[22] Filed: Dec. 1, 1987

[51] Int. Cl.⁴ .............................................. G01J 5/06
[52] U.S. Cl. ................................ 250/338.1; 250/352;
250/505.1
[58] Field of Search ................. 250/338.1, 352, 505.1;
378/147, 157, 158, 159

[56] References Cited

U.S. PATENT DOCUMENTS 3,227,880 1/1966 Wideroe ........................ 250/505.1

Primary Examiner—Carolyn E. Fields
Assistant Examiner—John A. Miller
Attorney, Agent, or Firm—Kenney & Lange

[57] ABSTRACT

A sharp edged aperture for use with radiation sensing apparatus to permit radiation to pass through a relatively thick layer of radiation absorbing material with a minimum of reflection off the edges of the opening by utilizing a thin layer of radiation blocking material overlaying the layer of radiation absorbing material.

13 Claims, 1 Drawing Sheet

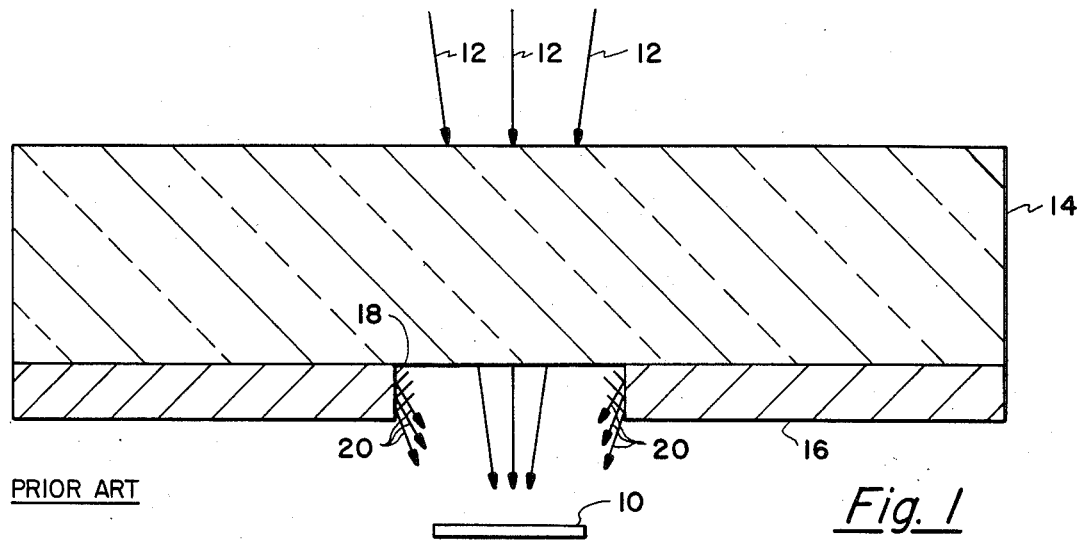
PRIOR ART    Fig. 1
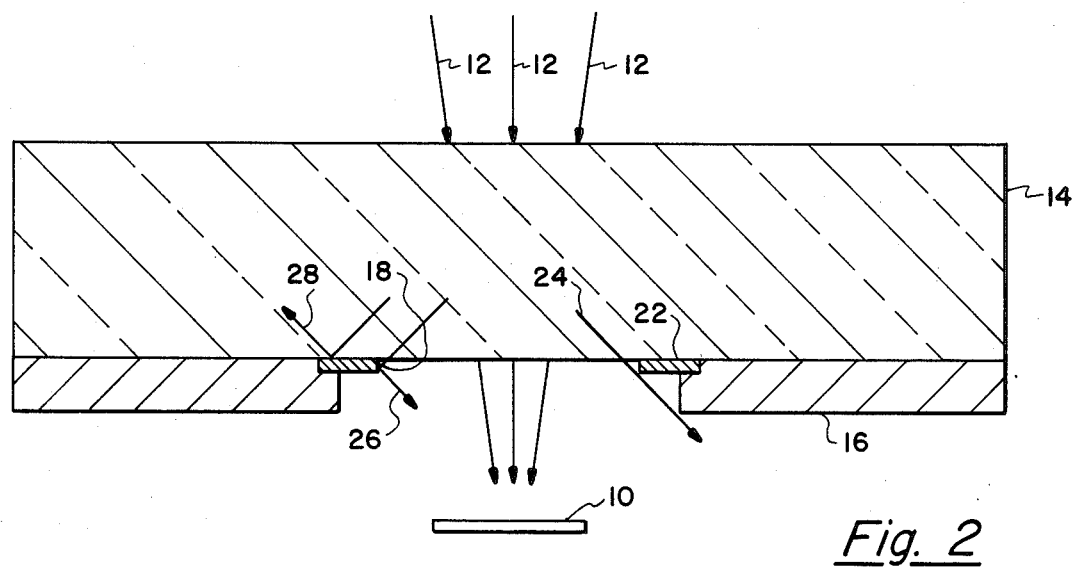
Fig. 2

SHARP EDGE FOR THICK COATINGS

BACKGROUND OF THE INVENTION

1. Field of the Invention

The present invention relates to radiation sensing devices which include a radiation absorbing layer having an opening therethrough of a thickness which allows reflection of the radiation off the edges of the material as it passes therethrough.

2. Description of the Prior Art

In the copending application of B.W. Denley, W.J. White and myself, Ser. No. 127,077, filed Dec. 1, 1987 and assigned to the assignee of the present invention, I show a cold shield for use in an array of radiation detectors. In this disclosure, a block of radiation transparent material has an upper surface coating formed of a plurality of parallel rows of apertures and a bottom layer coating including a plurality of apertures shaped generally like the detectors located therebeneath used to sense the radiation passing through the apertures. In this disclosure, the coating may comprise a plurality of infrared absorbing layers and, to be an effective radiation absorber, the coating is relatively thick. It has been found that radiation passing through the apertures in such coatings is able to reflect off the edges of the aperture and thus travel in an undesirable direction to impinge on detectors other than those intended. Accordingly, it is desired to minimize the amount of reflection off the edges of the aperture. One possible solution proposed has been to make the radiation absorbing material thinner so that there is less edge for reflections to strike, but this solution decreases the performance of the radiation absorber.

SUMMARY OF THE INVENTION

The present invention overcomes this problem by supplying, around the edge of the aperture, a thin layer of infrared radiation blocking material as, for example, a reflecting metal layer which overlaps the thicker absorbing material by a small amount and which defines the edge of the aperture through which infrared radiation may now pass without striking the edge of the absorbing material.

BRIEF DESCRIPTION OF THE DRAWINGS

FIG. 1 shows a prior art device comprising a block of radiation transparent material with a thick layer of radiation absorbing material on the bottom thereof defining an aperture; and FIG. 2 shows the present invention comprising the apparatus of FIG. 1 with a thin layer of radiation blocking material overlapping the thick layer of absorbing material.

DETAILED DESCRIPTION OF THE PREFERRED EMBODIMENTS

In FIG. 1, radiation from a remote source travels toward an infrared radiation detector 10 along paths shown by arrows 12 through a block of radiation transparent material 14 which has a cover of radiation absorbing material 16 on the bottom thereof. Radiation absorbing cover 16 has an aperture 18 therethrough which permits the passage of the radiation 12 to the detector 10. The block of radiation transparent material 14 may be germanium or, preferably, zinc sulfide so that it is also transparent to visible light for purposes of ease in alignment. The radiation absorbing cover 16 may be a plurality of layers of absorptive material often referred to as a dark mirror coating. If desired, and as shown in the above-referred to co-pending application Ser. No. 127,077, an additional cover of light blocking material may be applied to the upper surface of transparent block 14 and would also have apertures therethrough so as to permit the radiation traveling along paths 12 to reach detector 10.

FIG. 1 shows some of the rays 20 being reflected from the edges of aperture 18 and emerging from the aperture in various undesirable directions. These reflections may strike detector 10 or other detectors (not shown) adjacent detector 10 and, because they may represent off axis or background radiation, can reduce the sensitivity of the detector in undesirable fashion or produce an erroneous reading on adjacent detectors. Accordingly, it is desired to eliminate the reflections off of the edges of the aperture through the light absorbing material 16 as much as possible.

FIG. 2 shows the appartus of FIG. 1, but in FIG. 2 the aperture 18 is formed by a thin layer of light blocking material 22, for example a metal film, so as to form the same size aperture as was the case in FIG. 1. It is seen, in FIG. 2, that the light absorbing material 16 has been cut back from its position in FIG. 1 and may partially overlap the ends of the thin light blocking material 22. The cut back distance is just large enough so that a ray of radiation, such as ray 24, approaching the aperture 18 at angles encountered in operation will not strike the edges of the light absorbing material 16. It is seen that any reflection off the edge of light blocking material 22, such as shown by ray 26, is greatly reduced from the amount of reflection found in FIG. 1 and accordingly the undesirable radiation received by detector 10 and others will be minimized. Some reflection from the surface of the thin layer 22 as shown by ray 28 may occur. This radiation is reflected back up through the transparent material 14 and will most likely pass out of block 14 or be absorbed by the radiation absorbing material (not shown) along the top of block 14. Nevertheless, since reflections from the upper surface of light blocking material 22, as shown by ray 28, are undesirable, it is better to minimize the area of the light blocking material 22.

Although the present invention has been described with reference to preferred embodiments, workers skilled in the art will recognize that changes may be made in form and detail without departing from the spirit and scope of the invention.

What is claimed is:

1. Radiation responsive apparatus which includes an infrared radiation detector and a layer of infrared radiation absorbing material having an opening for radiation to pass therethrough to the detector, the opening extending from a first surface of the material through a first thickness thereof and exiting from a second surface comprising:

a layer of infrared radiation blocking material adjacent the first surface and positioned around the opening to form an aperture having edges of a second thickness less than the first thickness to minimize reflection of radiation from the edges.

2. Apparatus according to claim 1 wherein the infrared radiation detector is mounted proximate the second surface to receive radiation passing through the opening.

3. Apparatus according to claim 1 wherein the thickness of the absorbing material is such that the infrared radiation is prevented from passing therethrough.

4. Apparatus according to claim 3 wherein the infrared radiation absorbing material is a dark mirror coating.

5. Apparatus according to claim 3 wherein the infrared radiation blocking material overlaps the infrared radiation absorbing material by an amount sufficient to prevent radiation from striking the edges of the absorbing material.

6. Apparatus according to claim 5 wherein the infrared radiation blocking material is a metal film.

7. Apparatus according to claim 1 further including a base of infrared radiation transparent material having a lower surface and the infrared radiation absorbing material forms a coating thereon with the first surface in contact with the lower surface.

8. Infrared radiation responsive apparatus comprising:
- a layer of infrared radiation absorbing material of predetermined thickness and having first and second surfaces, the layer having an opening therethrough of a first cross-sectional area to permit radiation to pass therethrough;
- infrared radiation detector means mounted proximate the second surface and positioned to receive radiation passing through the opening; and
- infrared radiation blocking means of a thickness less than the predetermined thickness mounted proximate the first surface and having an aperture therethrough of a second cross-sectional area less than the first cross-sectional area and positioned to permit radiation passing through the aperture to pass through the opening to the detector means, the thickness of the radiation blocking means reducing the amount of reflection of radiation from the radiation absorbing material as it passes through the opening.

9. Apparatus according to claim 8 wherein the predetermined thickness is sufficient to prevent infrared radiation from passing therethrough.

10. Apparatus according to claim 9 wherein the second cross-sectional area is enough smaller than the first cross-sectional area so as to prevent radiation from striking the edge of the radiation absorbing material in the opening.

11. Apparatus according to claim 8 further including a base of infrared radiation transparent material adjacent the first surface of the light absorbing material.

12. The method of reducing unwanted infrared radiation received by an infrared detector comprising the steps of:
- A. forming a first opening in a first material having a first thickness proximate the detector to permit desired radiation to pass therethrough; and
- B. forming a second opening smaller than the first opening in a second material of a second thickness less than the first thickness on one side of the first opening so that radiation passes through the first opening and then through the second opening to reach the detector, the second opening being enough smaller than the first opening that none of the radiation strikes the edges of the first opening.

13. The method of claim 12 including the step of:
- C. affixing the first and second materials on a base of infrared radiation transparent material.

* * * * *

UNITED STATES PATENT AND TRADEMARK OFFICE
CERTIFICATE OF CORRECTION

PATENT NO. : 4,812,653
DATED : March 14, 1989
INVENTOR(S) : David M. Comey

It is certified that error appears in the above-identified patent and that said Letters Patent is hereby corrected as shown below: Title page:

In the References Cited Section, under U.S. PATENT DOCUMENTS, add the following Patents:

| | | | |
|---|---|---|---|
| 3,963,926 | 06/15/76 | Borrello | 250/338 |
| 4,576,679 | 03/18/86 | White | 156/644 |

Signed and Sealed this

Twenty-seventh Day of June, 1989

Attest:

DONALD J. QUIGG

Attesting Officer     Commissioner of Patents and Trademarks